United States Patent [19]
Biebuyck et al.

[11] Patent Number: 5,817,242
[45] Date of Patent: Oct. 6, 1998

[54] STAMP FOR A LITHOGRAPHIC PROCESS

[75] Inventors: Hans Andre Biebuyck, Thalwil; Bruno Michel, Gattikon, both of Switzerland

[73] Assignee: International Business Machines Corporation

[21] Appl. No.: 691,285

[22] Filed: Aug. 1, 1996

[51] Int. Cl.$^6$ ....................................................... B44C 1/22
[52] U.S. Cl. .................. 216/41; 216/44; 216/48; 216/54; 438/745; 438/749
[58] Field of Search .................. 216/41, 44, 48, 216/54; 438/745, 749

[56] References Cited

U.S. PATENT DOCUMENTS 5,512,131  4/1996  Kumar et al. .............................. 216/13

*Primary Examiner*—Mark Chapman
*Attorney, Agent, or Firm*—Robert M. Trepp

[57] ABSTRACT

A hybrid stamp structure for lithographic processing of features below 1 micron is described, comprising a deformable layer (14) for accommodating unevenness of the surface of a substrate, and a patterned layer on the deformable layer in which a lithographic pattern is engraved. The stamp structure is further enhanced by comprising a third layer (16), which acts as rigid support for the stamp, thus preventing an undesired deformation of the stamp under load.

9 Claims, 6 Drawing Sheets

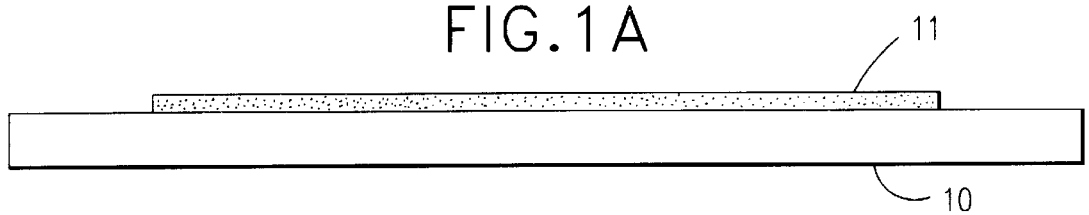
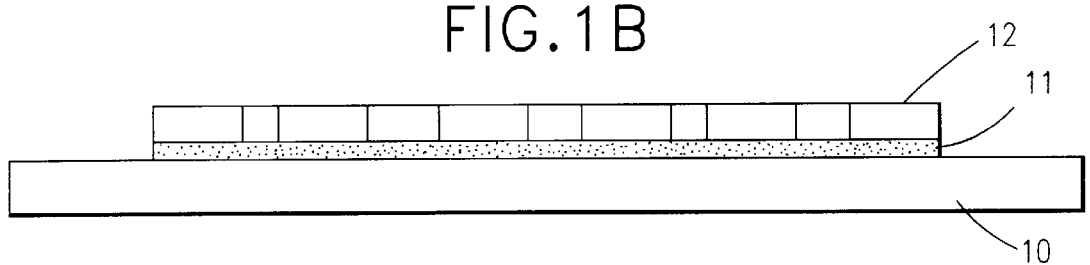
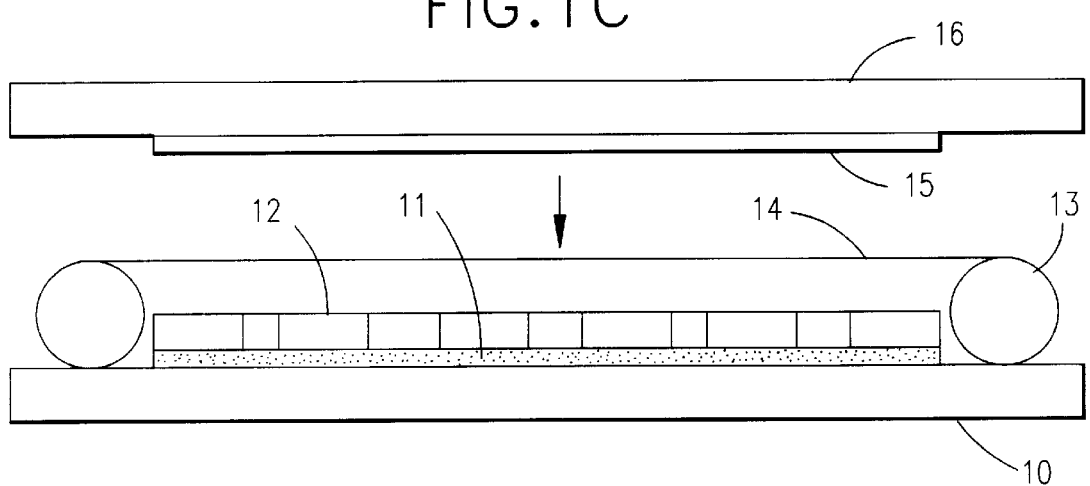
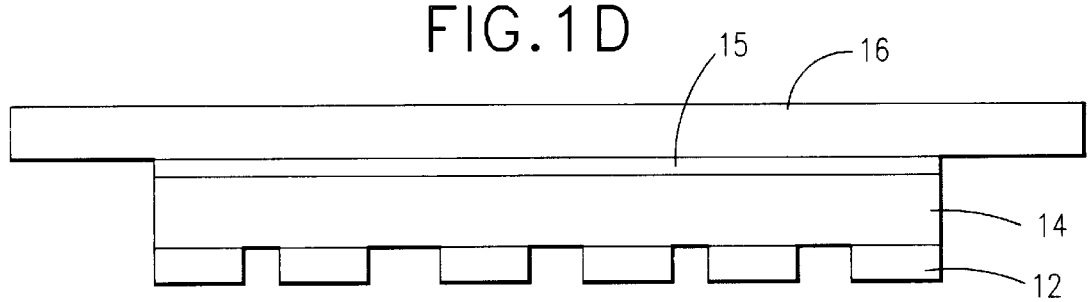
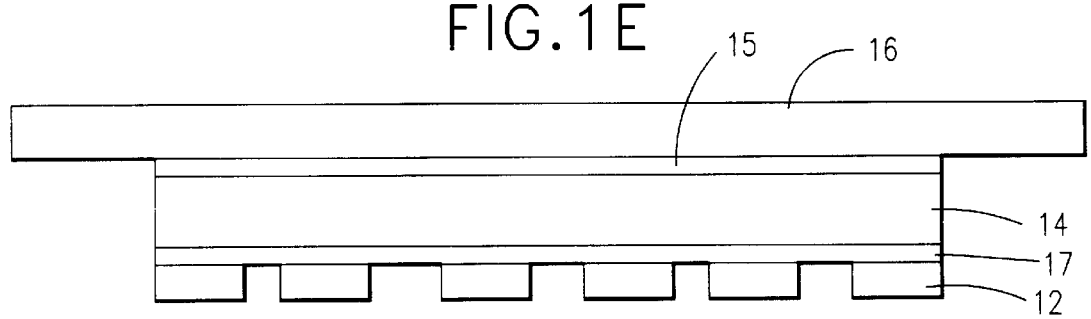

STAMP FOR A LITHOGRAPHIC PROCESS

The present invention is directed generally toward a lithographic process. More particularly, it relates to an elastomeric stamp for use in such a lithographic process.

BACKGROUND OF THE INVENTION

Since the emergence of integrated circuits (ICs) and micromechanical devices, optical lithography has been crucial for the purpose of their mass production: Its convenience, parallel operation and resolution has created a huge market. Fabrication of devices with ever smaller dimensions, necessary to satisfy the increasing demands of storage and computation, becomes increasingly problematic with visible light as processes steadily reaching fundamental limits, predominantly set by diffraction. This realization triggered intense research in UV, X-ray, e-beam, and Scanning Probe (SP) lithography. These methods deliver high resolution with varying success and their economics remain, at best, uncertain. Reasons for these uncertainties include limitations due to wavelength dependent phenomena, the slow writing speeds of e-beam and SP lithographies, and challenges in finding appropriate resists.

A separate and related limitation of current lithographies is the complexity of processes required for pattern transfer; lithography today relies on transfer of material from the liquid or gas phase using masks to protect certain regions of the substrate so that devices are filled in more than assembled.

An alternative approach to lithography has been published by A. Kumar and G. M. Whitesides in: Appl. Phys. Lett. 63 (14), Oct. 4, 1993, pp. 2002–2004. In this process, referred to as stamp lithography, stamps are fabricated by casting poly(dimethylsiloxane) (PDMS) on a master with a negative of the desired pattern. The PDMS stamp is peeled away from the master after curing and exposed to an "ink" transferred to the substrate by transient contact with the stamp. The elastomeric nature of the PDMS allows contact even on rough or curved surfaces. According to this method, features between 1 and 100 microns are achieved. For larger stamps and larger features (1 cm to 200 microns), the pattern is directly etched into the stamp by conventional UV lithography using a mild soap solution for dissolving those regions previously exposed to the UV light. When applying this method to lithography with submicron features, it was found that no reproducible results necessary for mass-production of ICs were attainable with a type of stamp as propagated by Kumar et al. A major limitation of this method of pattern transfer is the elastomer used as the carrier of the pattern. This material is deformable so that repeated, accurate transfer of the pattern to the substrate with high resolution, as necessary for practical lithography, is not possible.

Therefore, it is seen as an object of the invention to improve the method described by Kumar et al. such that stamp lithography can compete with the current state-of-the-art lithography. Particularly, features of 0.1 to 1 microns width should be achievable in a reproducible manner, suitable also for covering conventional wafer sizes.

SUMMARY OF THE INVENTION

The object of the invention is achieved by a stamp as set forth in the appended claims. The new composite stamp avoids the limitations of the prior art stamp. Using the new stamp, feature sizes or a "design rule" of below one micron can be achieved in a reproducible manner. Due to its novel structure it can be optimized for matching all important properties, i.e., rigidity, conformal contact, and accurate pattern transfer, simultaneously.

It is seen as an important feature of the invention that the stamp comprises a deformable or elastic layer for conformal contact, accommodating the fluctuations of the thickness of the substrate and impurities on its surface, and a second (patterned) layer, which carries the desired pattern. This layer is preferably made of a material having a Young's modulus in the range of $10^4$ to $10^7$, more preferably of $0.25*10^6$ to $5*10^6$ dyne/cm$^2$. Material having this property can be poly(butyldiene), poly(dimethylsiloxane), poly(acrylamide), poly(butylstyrene) and co-polymers of these types. It is desirable to optimize the properties of the elastic layer such as to control the desired amount of flexibility.

A stamp made in accordance with the invention has several advantages over the known uniform elastomeric stamp. The materials of both layers can be optimized to a large extent independently of each other. Thus it is desirable to have a patterned layer to which submicron features can readily be written by a lithographic process. The patterned layer should also easily adhere to or absorb a specific "ink" material. It is further desirable to produce the patterned layer from a preferably non-deformable material which accurately preserves the pattern features even after repetitive application in the lithographic process. The patterned layer can be made of a material with a high Young's modulus, preferably above $10^6$ dyne/cm$^2$. Suitable materials could be organic, such as poly(styrene) or poly(methylmethacrylate), metallic, such as gold, platinum, palladium, nickel, titanium and oxides thereof, or inorganic insulators like alumina, silicon, silica, or perovskites, depending on the desired properties and application.

In a preferred embodiment of the invention, the elastomeric layer is mounted onto a rigid support structure being even within a tolerance of less than 10 microns, preferably in the range of 1 micron to 1 nm. A preferred support material has a thermal expansion coefficient close to the one of the substrate material. The support is preferably chosen from a group consisting of glass, quartz glass, rigid plastics material, or the substrate or wafer material, e.g. silicon. When mounted on a support structure, the elastic layer itself can be thin. Its thickness lies preferably in a range of 10 to 1000 microns. In this range of thickness, any deformation can be accommodated by the elastic layer, while the features of the pattern maintain their dimensions even when the stamp is pressed during the lithographic process. When protruding self-alignment means are used, as are described below, the thickness of the elastic layer may preferably be chosen from a range of 10 to 10000 microns. Obviously, a support structure as described above can also be advantageously applied to the known one-layer stamps as described by Kumar et al.

In a further preferred embodiment, the stamp comprises means for achieving a self-alignment. The means could either comprise key-and-lock type topological features, e.g. cone- or pyramid-shaped protrusions and holes, which after a sufficiently accurate pre-positioning by stepping drives guide the stamp into the desired final position. A preferred means for self-aligning the stamp and the substrate however exploits surface tension gradients provided on the surface of the stamp and/or substrate. These gradients are, for example, achieved by distributing pads on the surface of substrate and stamp, said pads being characterized by a modified surface providing a higher affinity to a liquid, e.g. oil or water.

These and other novel features believed characteristic of the invention are set forth in the appended claims The invention itself however, as well a preferred mode of use, and further objects and advantageous thereof, will best be understood by reference to the following detailed description of illustrative embodiments when read in conjunction with the accompanying drawings.

DESCRIPTION OF THE DRAWINGS

The invention is described in detail below with reference to the following drawings:

FIGS. 1A–1D illustrate basic steps of a first method for producing a stamp according to the invention.

FIG. 1E illustrates an alternative embodiment of the embodiment shown in FIG. 1D.

MODE(S) FOR CARRYING OUT THE INVENTION

Figure 2A:
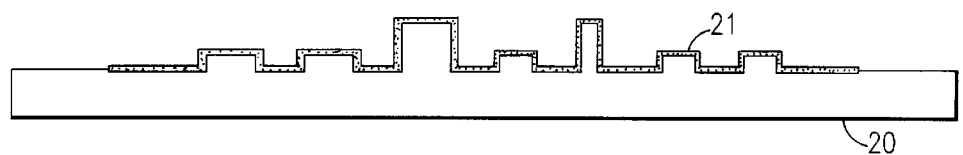
FIGS. 2A–2D illustrate basic steps of a second method for producing a stamp according to the invention.
Figure 2B:
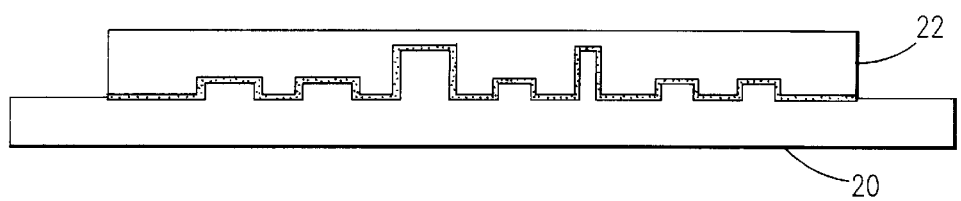
Figure 2C:
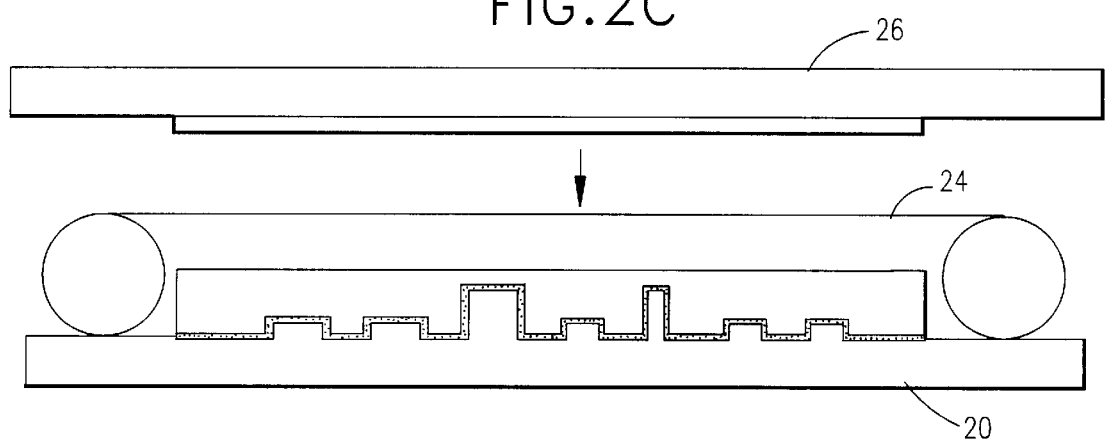
Figure 2D:
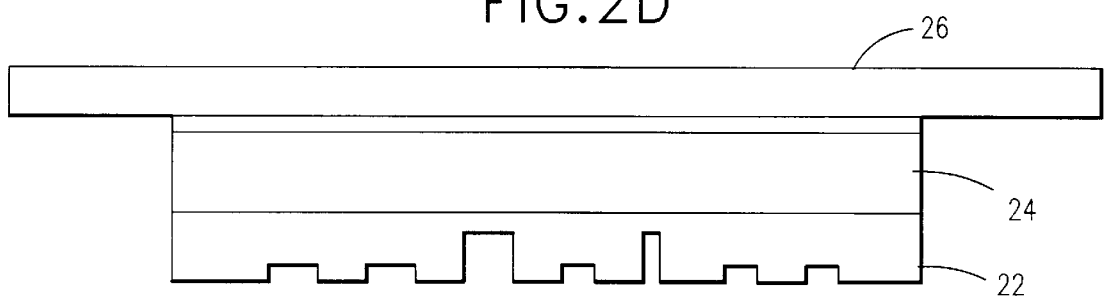

A first example of the invention is now described, referring to FIGS. 1A to 1D. The process starts with a silicon wafer 10, which provides a very flat surface. The surface is coated with a thin layer 11 of perfluorinated silane.

The perfluorinated silane prevents an adhesion or bonding of the following layers to the silicon surface. Next, a layer 12 of a brittle material capable of accurately holding a pattern is deposited onto layer 11. The brittle material is either poly(methylenmethacrylate)(PMMA), which is deposited by spincoating or polysilicon which is deposited by chemical vapor deposition. Both deposition methods are well known in the art. The layer thickness is chosen in dependence of the average features size, the so-called "design point" in a ratio of approximately 1:1. The layer 12 is structured by conventional UV lithography, or alternatively by e- beam lithography. Spacer elements 13 are positioned on the wafer 10. Into the volume defined by the spacer elements, pre-polymers of poly(dimethylsiloxane) (PDMS) are cast to form, after a curing process, an elastic layer 14 over the patterned PMMA or polysilicon 12. A second silicon wafer 16 is lowered onto the spacer elements, squeezing any surplus amount of PDMS through gaps between the spacer elements. This second silicon wafer is pre-treated with an olefin terminated silane which provides a glue-like layer 15 to bond to the PDMS. By lifting the assembly, the lower layer 10 of silicon is separated from the rest. Thereafter, the patterned layer of PMMA or polysilicon is developed by dissolving or etching the exposed areas, resulting in a composite stamp structure as illustrated by FIG. 1D.

An additional layer 17 can be introduced between the patterned PMMA layer 12 and the deformable layer 14 to provide an additional support for the pattern after its development. In the example as illustrated by FIG. 1E, this intermediate layer consists of PMMA. However this layer can be replaced by a layer of indium tin oxide (ITO), an electrically conductive material. This additional layer besides providing an enhanced stability of the pattern (and electrical conductivity) also prevents the elastic material of layer 14 from penetrating through the openings of the patterned layer 12.

A second method for producing a composite stamp is illustrated by FIGS. 2A–2D. First, a master substrate 20 is provided by any conventional lithography method (or by the stamping lithography describe herein). The master pattern is treated with perfluorinated silane 21 as a separating agent. Thereafter, a layer 22 of PMMA is spincoated onto the assembly. The following steps (FIGS. 2C, 2D) correspond to those of the previous example. By lifting the assembly, the stamp and the master are separated, leaving the master 20 for further replication of the stamp.

Figure 3:
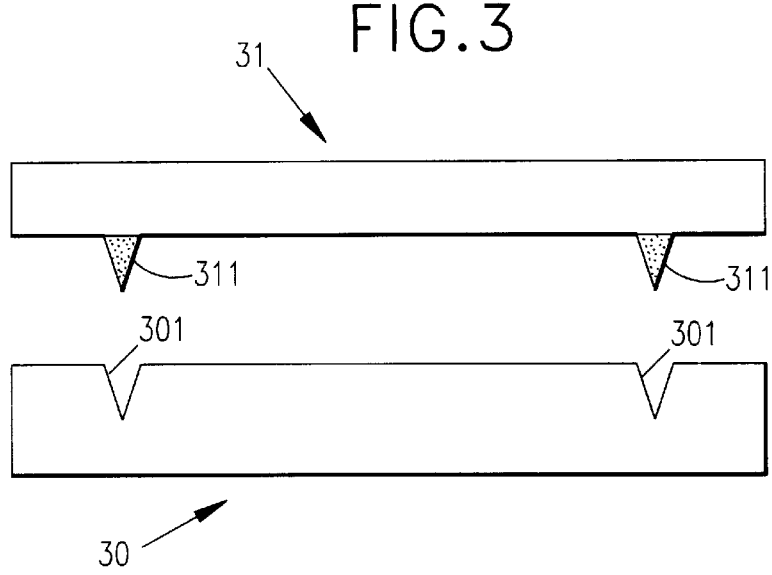
FIG. 3 illustrates a key-and-lock type means for self-alignment of a stamp and a substrate.

Referring now to FIG. 3, a first self-alignment means on substrate 30 and stamp 31 is shown, comprising of wedge-shaped protrusions 311 of PMMA exceeding the features of the lithographic pattern 312. The protrusions 311 fit exactly into corresponding recesses 301 of the substrate. This can be achieved by employing the same alignment stamp when producing the recesses 301 in the substrate and in the master from which the stamp is replicated. Provided that the substrates are made of the same material and all etching parameters are equal, the wedges 311 and the recesses 301 match exactly. This concept of providing matching marks on the substrate and on the stamp is described in further detail below.

Figure 4A:
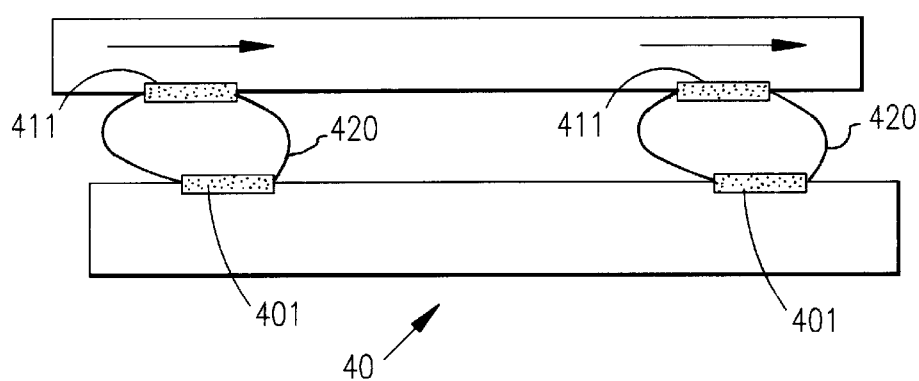
FIGS. 4 A,B illustrates means for self-alignment of a stamp and a substrate based on a surface tension gradient.
Figure 4B:
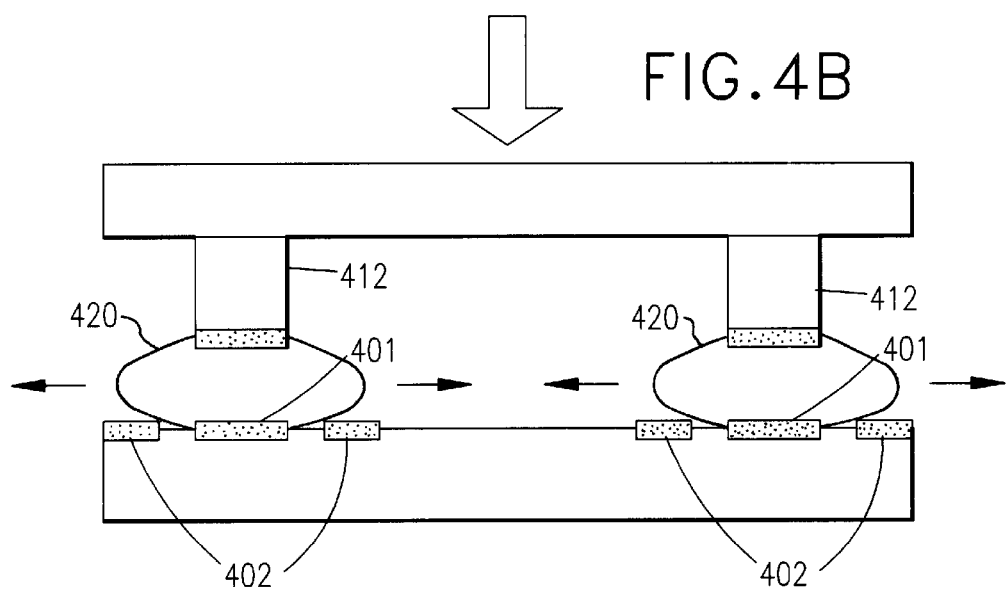

Whereas in the lock-and-key type of self-alignment the geometrical shape of the features, e.g. the tilted sidewalls, cause a fine-adjustment of the stamp and the substrate, the following example of self-alignment means, as being illustrated by FIGS. 4A and 4B, is based on the property or tendency of a liquid to minimize its surface. With hydrophilic pads 401, 411 on the surfaces of both, the substrate 40 and the stamp 41, together with a controlled amount of moisture, leading to the formation of small droplets on and between these pads, an efficient self-aligning mechanism is realized: In case of a small misalignment of the stamp with respect to the substrate, a sandwiched droplet 420 provides a restoring force back to the regular shape, thereby moving the stamp into its desired position. The droplet can be generated in a controlled manner by exposing the pads to a moisturized inert gas (humidified nitrogen). It should be noted that the features of FIG. 4 are as all other figures not drawn to scale. The size of the droplet should be approximately of the order of the cubic of the design rule.

The efficacy of this method can be increased by depositing a hydrophobic zone 402 around each of the pads 401 or by placing the pads on post-type supports 412 as shown in FIG. 4B. Another advantageous property of the sandwiched droplet 420, also illustrated by FIG. 4B, is its acting as an elastic cushion when pressure is exerted upon the assembly. Thus, the stamp immediately is lifted from the substrate when releasing the exerted pressure by the spring forces of the deformed droplets 420 and/or posts 412.

Self-alignment means should be placed in the vicinity of cleavage lines of the wafer thus ensuring that a minimum of utilizable wafer area is occupied. The lateral dimensions of the self-alignment means again are in the order of the design rule.

The following figures are to illustrate the basic steps of preparing an aligned assembly consisting of a wafer substrate and one or several stamps.

Figure 5:
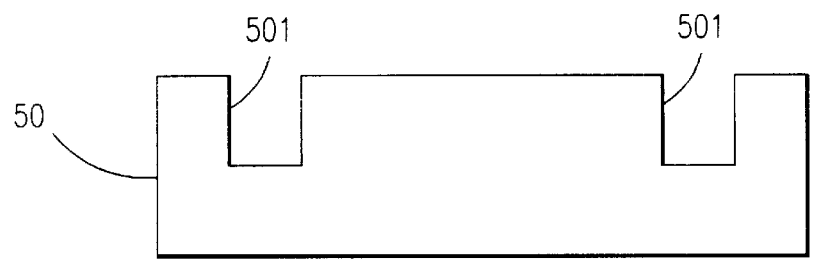
FIGS. 5–7 illustrates the basic steps of preparing a stamp and a substrate for stamp lithography.
Figure 6A:
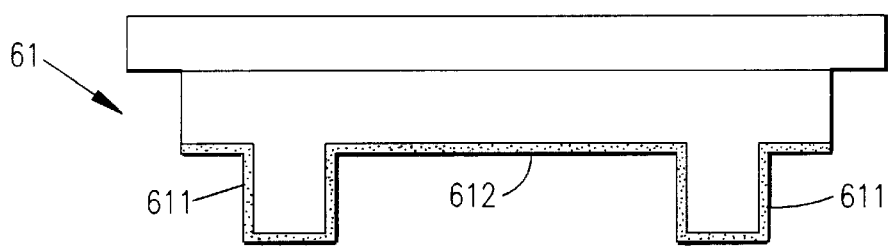
Figure 6B:
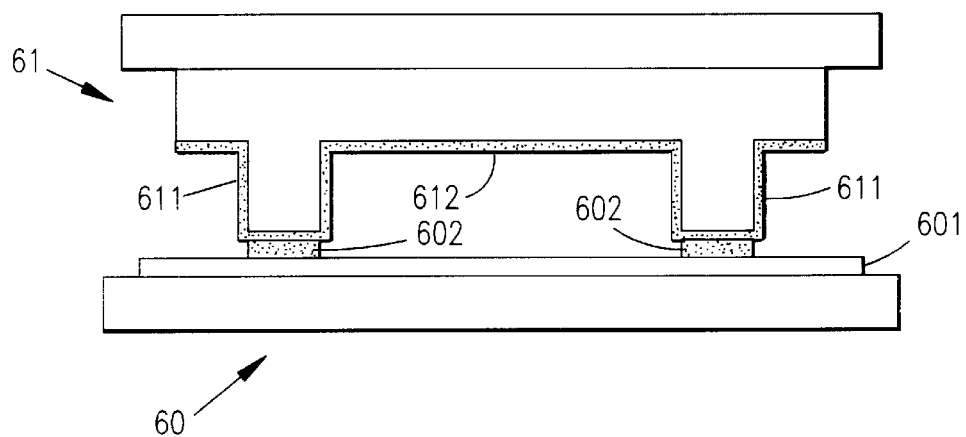

In a first step, an alignment master 50 as shown in FIG. 5 is prepared, which carries recesses 501 at preselected positions, which preferably are located at regions designed to be the cleavage lines of the wafer to be manufactured. Of the alignment master several alignment stamps 61 can be produced as replicas carrying alignment marks 611 (FIG. 6A). To provide hydrophilic pads on a wafer, a replica of the alignment stamp is inked with 16-mercaptohexadecanol acid 612 or, alternatively, with 16-mercaptohexadecanol, which is transferred by stamp contact printing (FIG. 6B) onto a wafer 60 covered with a thin gold film 601, which adheres to the thiol. The uncovered gold film is then removed, exploiting the thiol pad 602 as protective coating. After evaporating another gold film while shielding the neighborhood of the pads by a mask, the wafer is prepared for further processing (FIG. 6C).

Figure 6C:
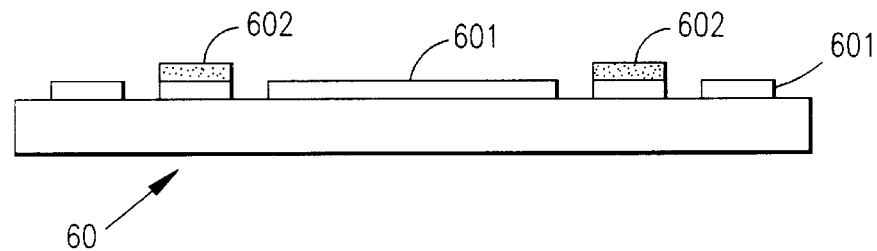
Figure 7A:
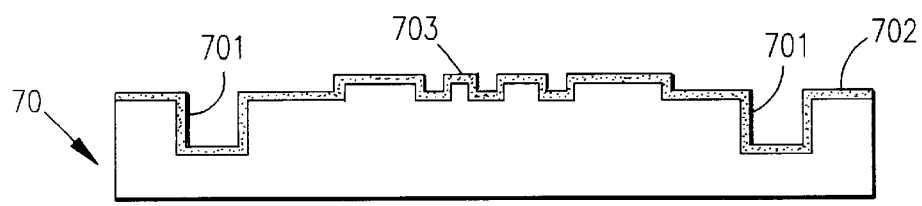

Referring now to FIG. 7A, a silicon stamp master 70 is shown coated with perfluorinated silane 702. Prior to the lithographic pattern 703, alignment recesses 701 are marked and etched into the silicon using an alignment stamp drawn from the alignment master as shown in FIG. 5. The lithographic pattern 703, produced by conventional e-beam lithography, is written using coordinates relative to the alignment marks 701. By using the same alignment stamp for different stamp masters and by positioning the lithographic pattern relatively to the alignment marks, stamps with different lithographic patterns can be manufactured. These stamps can replace the masks used in the known lithographic methods. Due to the above described manufacturing procedure, these stamps are inherently aligned to each other. By using the same alignment stamp for the wafer, as is described above when referring to FIGS. 6A–6C, all such produced stamps can be placed in a self-aligning fashion onto the wafer.

Figure 7B:
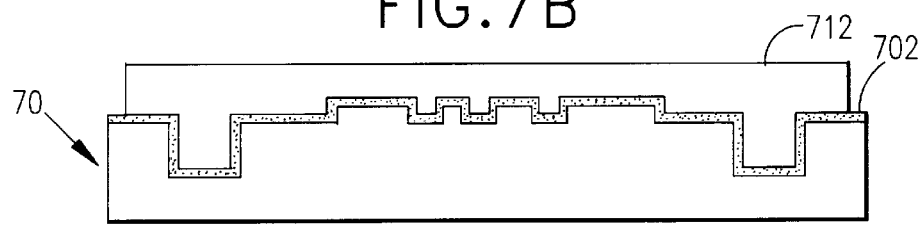
Figure 7C:
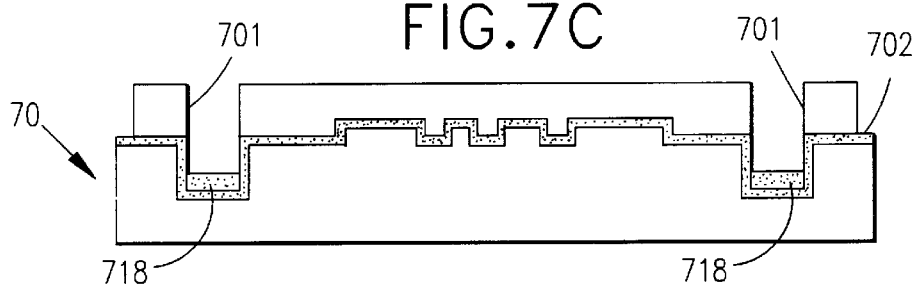
Figure 7D:
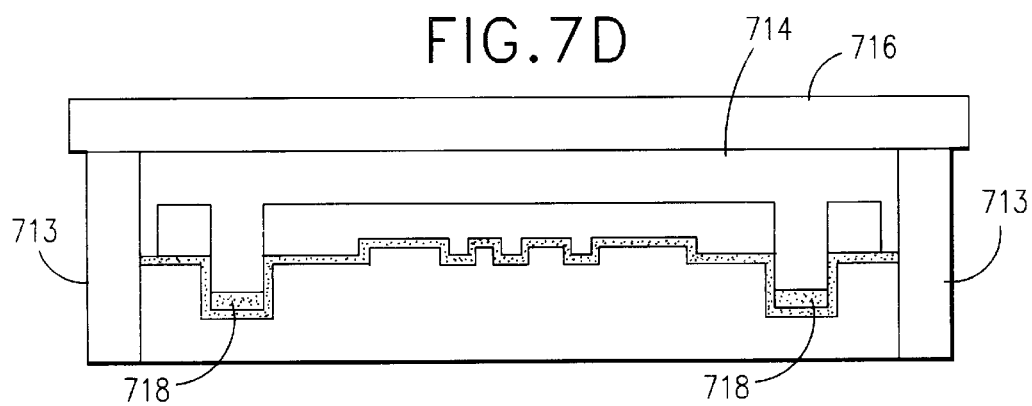
Figure 7E:
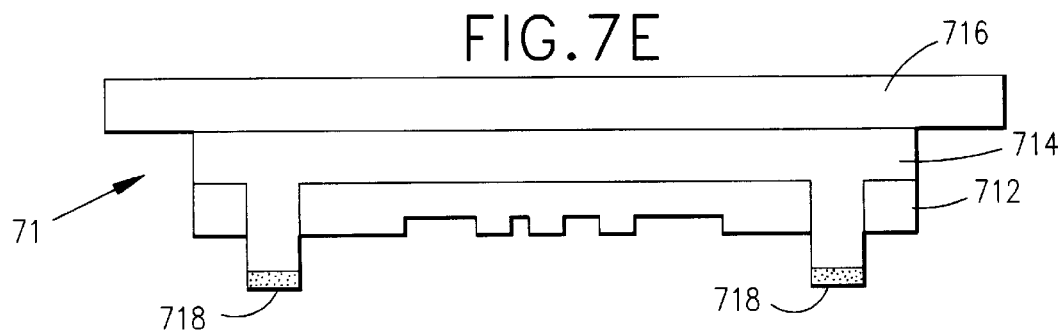
Figure 7F:
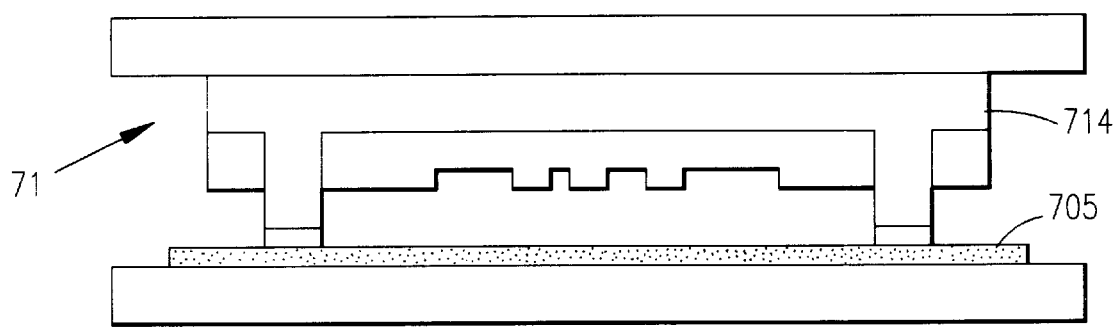
Figure 7G:
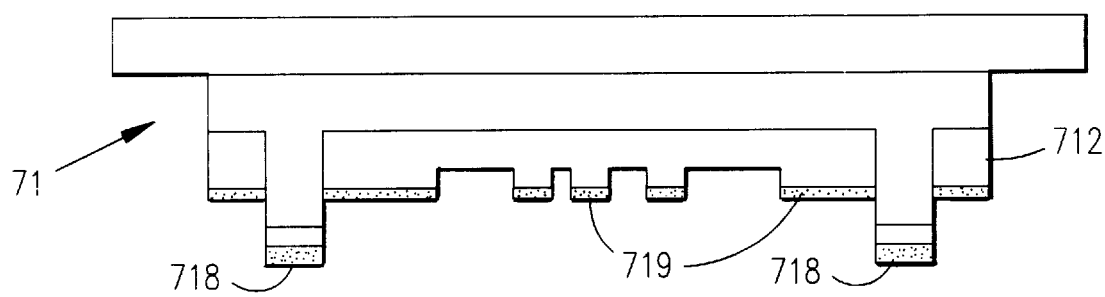

The stamp master is spincoated with the pattern layer of the composite stamp 712 (PMMA), shown in FIG. 7B. Before applying the elastic layer 714 (PDMS), the resist within the recesses 701 is exposed, etched away and replaced by a thin layer of gold 718 (FIG. 7C). Then spacer elements 713 are installed at the perimeter of the stamp master, and the thus created volume is filled with the elastomer 714 (FIG. 7D). As described above, a second silicon plate 716 is applied as supporting layer. After lifting the stamp assembly and trimming of its rim (FIG. 7E), the stamp 71 is dipped into a solution of carboxyl (COOH) terminated thiols 705 to apply hydrophilic pads 718 to the alignment protrusions 711. The preparation of the stamp 71 is completed by wetting the layer 712 with lithographic pattern with the substance 719 to be transferred to the wafer (FIGS. 7F, 7G).

Figure 8:
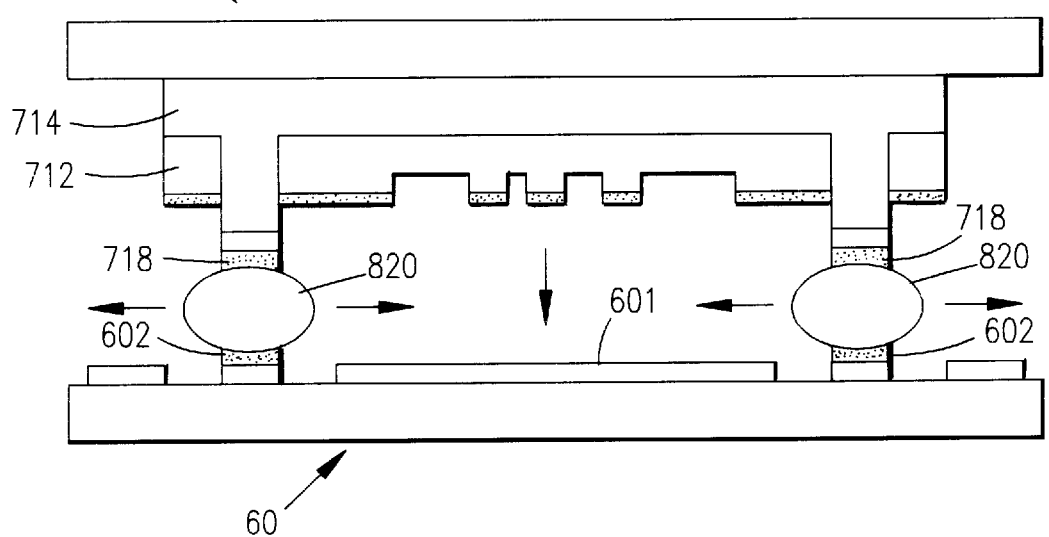
FIG. 8 illustrates the use of a new stamp in accordance with the invention in a lithographic process.

For the actual lithographic process, as illustrated by FIG. 8, a moisture carrying gas is blown over the hydrophilic pads 601 on the surface of the wafer 60 as prepared in a previous step (FIG. 6C). The stamp 71 is positioned by known alignment means such that its hydrophilic pads 718 are in approximate juxtaposition of those on the wafer. The final alignment is then achieved by the surface tension of the droplets 820 sandwiched between the hydrophilic pads.

The lithographic pattern is transferred to the wafer 60 by exerting pressure on the stamp 71 until the wetted layer 712 touches the surface layer 601 of the wafer. The substance 719, which could be a reactant, etchant, protective coating, etc., is then transferred at all areas of contact.

We claim:

1. A stamp structure for a lithographic process, comprising a deformable first layer of a first material, and a second layer of a second material positioned on said deformable first layer, said second layer having a lithographic pattern to be transferred to a substrate, said deformable first layer deforming to permit conformal contact of said second layer to the surface of said substrate at times a load is applied.

2. The stamp structure of claim 1, further including a rigid support for preventing an undesired deformation of said deformable first layer under said load.

3. The stamp structure of claim 1, further comprising self-aligning means (301, 311; 401, 411, 420) for an accurate relative positioning and/or deformation of the substrate (30; 40) and the stamp structure (31; 41) during the lithographic process.

4. The stamp structure of claim 3, wherein the self-aligning means comprises protruding elements (311) and corresponding recess elements (301), preferably with tilted sidewalls.

5. The stamp structure of claim 3, wherein the self-aligning means comprises a surface tension gradient.

6. The stamp structure of claim 5, wherein surface tension gradient is achieved by pads (401, 411) having a higher affinity to a liquid than their surrounding areas.

7. Use of a stamp structure in accordance with claim 1 for submicron lithography.

8. A lithographic process comprising the steps of:

selecting a stamp structure comprising a deformable first layer of a first material, and a second layer of a second material positioned on said deformable first layer, said second layer having a lithographic pattern to be transferred to a substrate, said deformable first layer deforming to permit conformal contact of said second layer to the surface of said substrate at times a load is applied;

applying a substance to said patterned layer; and bringing said second layer into conformal contact with said surface of said substrate.

9. The lithographic process of claim 8, further comprising the steps of preparing a master alignment stamp carrying alignment marks; and using said alignment master for reproducing self-alignment means on the substrate and the patterned layer at precisely corresponding positions.

* * * * *